US011778759B2

(12) United States Patent
Muranski et al.

(10) Patent No.: US 11,778,759 B2
(45) Date of Patent: Oct. 3, 2023

(54) UNIVERSAL CONTROL MODULE FOR A REVERSING CONTACTOR

(71) Applicant: Rockwell Automation Technologies, Inc., Mayfield Heights, OH (US)

(72) Inventors: Piotr Muranski, Katowice (PL); William H. Martin, Milwaukee, WI (US); Szymon Piechota, Katowice (PL); Mark Davidsz, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 447 days.

(21) Appl. No.: 17/140,684

(22) Filed: Jan. 4, 2021

(65) Prior Publication Data

US 2022/0217853 A1 Jul. 7, 2022

(51) Int. Cl.
 *H01H 9/20* (2006.01)
 *H05K 5/00* (2006.01)
 (Continued)

(52) U.S. Cl.
 CPC ......... *H05K 5/0069* (2013.01); *H01H 47/001* (2013.01); *H01H 51/005* (2013.01);
 (Continued)

(58) Field of Classification Search
 CPC .. H05K 5/0069; H05K 5/0217; H01H 47/001; H01H 51/005; H01H 50/002;
 (Continued)

(56) References Cited

U.S. PATENT DOCUMENTS 3,388,353 A * 6/1968 Isler ................... H01H 11/0012
 335/132
4,991,061 A 2/1991 Strange
 (Continued)

FOREIGN PATENT DOCUMENTS

DE 3823574 C1 11/1989
EP 2469566 A1 6/2012
EP 3018677 A1 5/2016

OTHER PUBLICATIONS

Schneider Electric; "TeSys island System Guide"; dated Jan. 2020—(102) pages.
 (Continued)

*Primary Examiner* — Shawki S Ismail
*Assistant Examiner* — Lisa N Homza
(74) *Attorney, Agent, or Firm* — Boyle Fredrickson, S.C.

(57) ABSTRACT

A control module for a reversing contactor includes a housing configured to mount to forward and reverse contactors. The control module is configured to receive command signals for the forward and reverse contactors and provide the command signals to an interlock circuit included within the housing of the control module. The interlock circuit is configured to use the forward and reverse commands as well as feedback signals corresponding to the current status of the contactors to prevent both the forward and reverse contactors from being closed in tandem. The control module is also configured to mount to contactors having different physical sizes. The housing may be configured as a telescoping housing, where one portion of the housing is fixed and a second portion of the housing slides with respect to the fixed portion of the housing to adjust the width of the control module.

20 Claims, 7 Drawing Sheets

(51) Int. Cl.
  H05K 5/02 (2006.01)
  H01H 47/00 (2006.01)
  H01H 51/00 (2006.01)
  H02P 23/24 (2016.01)
  H02P 5/74 (2006.01)
  H01H 50/00 (2006.01)
  H01H 50/02 (2006.01)

(52) U.S. Cl.
  CPC ......... *H05K 5/0217* (2013.01); *H01H 50/002* (2013.01); *H01H 50/02* (2013.01); *H01H 50/021* (2013.01); *H02P 5/74* (2013.01); *H02P 23/24* (2016.02)

(58) Field of Classification Search
  CPC .... H01H 50/02; H01H 50/021; H01H 9/0207; H02P 5/74; H02P 23/24
  USPC ......................................................... 335/160
  See application file for complete search history.

(56) References Cited

U.S. PATENT DOCUMENTS

| | | |
|---|---|---|
| 5,289,146 A | 2/1994 | Plumeret et al. |
| 5,506,485 A | 4/1996 | Mueller et al. |
| 6,140,896 A | 10/2000 | Heckenkamp |
| 2018/0013220 A1* | 1/2018 | Haensgen ............. H01R 12/79 |
| 2022/0102103 A1* | 3/2022 | Marzano ............... H01H 50/04 |

OTHER PUBLICATIONS

Eaton; "SmartWire-DT: Cost Optimization, Clever Communication"; dated Nov. 2013—(20) pages.
Extended European Search Report dated May 20, 2022; Application No./Patent No. 21215519.6-1201—(12) pages.
EESR dated Jul. 11, 2022; Application No./Patent No. 21215519.6—(11) pages.

* cited by examiner

UNIVERSAL CONTROL MODULE FOR A REVERSING CONTACTOR

BACKGROUND INFORMATION

The subject matter disclosed herein relates to a control module for a reversing contactor. More specifically, an adaptable control module for contactors of varying sizes is configured to receive a single communication connection which provides control signals for both forward and reverse contactors.

As is known to those skilled in the art, electric motors are widely used in industrial control systems to drive a desired motion, such as a fan, pump, gearbox, linear actuator, or the like. In some applications, precise control of speed and/or position of the motor is desired. A motor drive may receive a motion profile and control the motor accordingly. In many applications, however, control of the motor may require simply that the motor be enabled or disabled to operate at rated speed according to the frequency of the line voltage to which it is connected. It may also be desirable to control the motor to run either forward or reverse. In such applications, a contactor, for single direction operation, or a pair of contactors, for dual direction operation may be provided. Control signals are provided to energize each of the contactors, closing the contacts and providing line voltage to the motor.

Historically, it was known to provide a pair of relays which, in turn, could be controlled by an industrial controller, such as a programmable logic controller (PLC), to control operation of a reversing motor contactor. A first relay is configured to selectively close responsive to control signals from the PLC and to provide voltage to the solenoid on the forward contactor, and a second relay is configured to selectively close responsive to control signals from the PLC and to provide voltage to the solenoid on the reverse contactor. When voltage is provided to either solenoid, the respective contactor closes, supplying line voltage to the motor.

As is also known to one skilled in the art, when the line voltage is a three-phase, alternating current (AC) voltage, connecting the line voltage to the motor with a first phase relationship, such as Va, Vb, and Vc, causes the motor to rotate in one direction. Connecting the line voltage to the motor in a second phase relationship, such as Va, Vc, and Vb, where two of the phases are reversed, causes the motor to rotate in the other direction. The input terminals of a forward contactor, therefore, may be wired in the first phase relationship, and the input terminals of a reverse contactor may be wired in the second phase relationship. The motor is wired to the output terminals of each contactor in a consistent relationship. Alternately, the line voltage could be wired to the input terminals of each contactor in a consistent relationship and two output terminals from the different contactors may be connected to the motor in a reverse relationship. Energizing the solenoid and closing the contacts within the respective contactors will supply the line voltage to the motor with a differing phase relationship to achieve a desired direction of rotation of the motor.

Because two of the phases are reversed between a forward and a reverse contactor, it would be undesirable to have both contactors closed at the same time. Closing both contactors would result in a short circuit between the two reversed phases of the line voltage. In order to avoid both contactors closing in tandem, the relays and contactors are electrically connected in a manner to prevent such an operating condition. Auxiliary contacts on each contactor open and close in tandem with the primary contacts used to supply line voltage to the motor. The auxiliary contacts are wired in series with the control signal to the control relays for each contactor requiring the reverse contactor to be open prior to closing the forward contactor and requiring the forward contactor to be open prior to closing the reverse contactor.

However, the additional wiring required to ensure that both contactors are not open at the same time is not without certain disadvantages. The additional relays create expense and require space in a control cabinet. The additional wiring from the auxiliary contacts to interlock the two contactors creates still further expense and is prone to wiring errors.

Thus, it would be desirable to provide to provide a control module for a reversing contactor that prevents both contactors from being closed in tandem without requiring the additional electrical wiring between control relays.

BRIEF DESCRIPTION

According to one embodiment of the invention, a control module for a first contactor and a second contactor defining, at least in part, a reversing contactor includes a housing, first, second, and third connectors, and an interlock circuit. The housing is configured to be mounted to the first contactor and to the second contactor. The first connector is accessible via an opening in the housing, and the first connector is configured to receive a complementary control connector. The second connector is mounted within the housing and is configured to connect to the first contactor. The third connector is mounted within the housing and is configured to connect to the second contactor. The interlock circuit is mounted within the housing and is operatively connected between the first connector and each of the second and third connectors. The complementary control connector is configured to deliver a first command signal and a second command signal to the control module. The first command signal is conducted from the first connector to the second connector via the interlock circuit to control operation of the first contactor, and the second command signal is conducted from the first connector to the third connector via the interlock circuit to control operation of the second contactor. The interlock circuit prevents the first contactor and the second contactor from closing in tandem.

According to another embodiment of the invention, a method for controlling a first contactor and a second contactor defining, at least in part, a reversing contactor is disclosed. A control module is mounted to the first contactor and to the second contactor, where the control module includes a housing, a first connector extending from the housing and configured to engage the first contactor, and a second connector extending from the housing and configured to engage the second contactor. A first command signal and a second command signal are received at a third connector in the control module. The first command signal controls operation of the first contactor, and the second command signal controls operation of the second contactor. The first command signal and the second command signal from the third connector are transmitted to an interlock circuit mounted within the housing. The interlock circuit verifies that the second contactor is open prior to transmitting the first command signal to the first contactor via the first connector and verifies that the first contactor is open prior to transmitting the second command signal to the second contactor via the second connector.

According to another embodiment of the invention, a control module for a first contactor and a second contactor defining, at least in part, a reversing contactor, includes a housing, a first, second, and third connector, and a first and second circuit board. The housing is configured to be mounted to the first contactor and to the second contactor. The first connector is configured to receive a complementary control connector via a first opening in the housing. The first circuit board is mounted within the housing, and the second connector is mounted to the first circuit board. The second connector extends through a second opening in the housing and is configured to connect to the first contactor. The second circuit board is mounted within the housing, and the third connector is mounted to the second circuit board. The third connector extends through a third opening in the housing and is configured to connect to the second contactor. The complementary control connector is configured to deliver a first command signal and a second command signal to the control module. The first command signal is conducted from the first connector to the second connector to control operation of the first contactor, and the second command signal is conducted from the first connector to the third connector to control operation of the second contactor. The housing has an adjustable width and is configured to mount to first and second contactors of varying widths.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
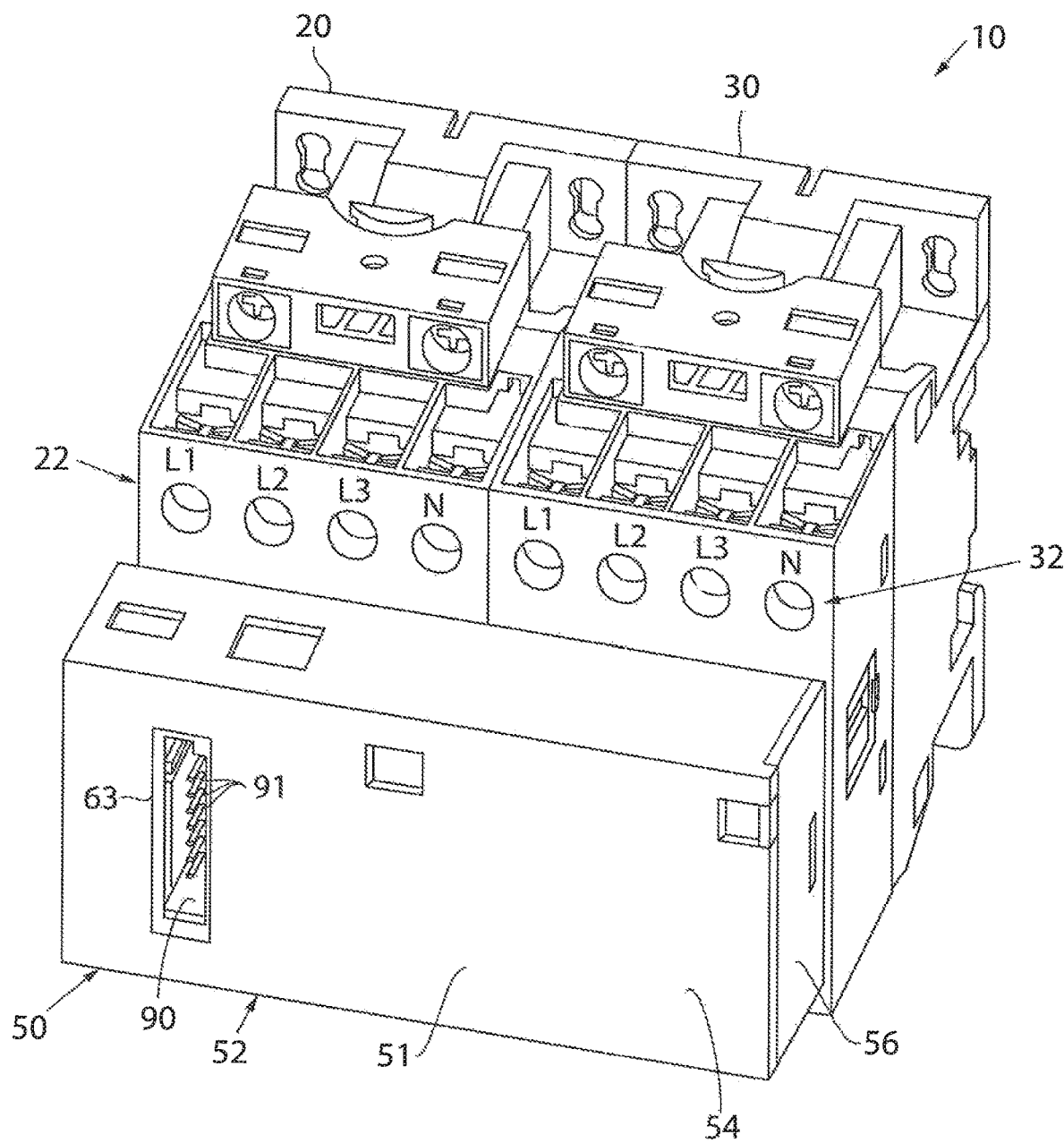
FIG. 1 is an isometric view of a reversing contactor and a control module according to one embodiment of the invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

The subject matter disclosed herein describes a control module for a reversing contactor that prevents both contactors from being closed in tandem without requiring the additional electrical wiring between control relays. The control module includes a housing configured to mount to the forward contactor and to the reverse contactor of a reversing contactor. The control module is configured to receive a control connector, where the control connector delivers a first command signal for the forward contactor and a second command signal for the reverse contactor. According to one embodiment of the invention, the control module includes a first connector, accessible through an opening in the front of the housing, which is configured to receive the control connector. Second and third connectors extend from the rear of the housing and are configured to engage the forward and reverse contactors. It is contemplated that the second and third connectors may extend through openings in the rear of the housing or be mounted to the rear of the housing with electrical connections established to the connectors within the housing.

The control module is configured to eliminate external wiring which was previously required to interlock the forward and reverse contactors, preventing them from being activated in tandem. An interlock control circuit is included within the housing of the control module. The interlock control circuit is configured to receive the first and second command signals from the first connector. According to one embodiment of the invention, the first and second command signals may be discrete signals corresponding to a forward command or to a reverse command. According to another embodiment of the invention, the control module may be configured to connect to an industrial network via the first connector and may include a network interface to extract the forward and reverse commands from data packets transmitted via the industrial network. The interlock control circuit may also receive feedback signals from the forward and reverse contactors via the second and third connectors, where the feedback signals indicate whether the contactor is open or closed. The interlock circuit is configured to use the forward and reverse commands as well as the feedback signals to prevent both the forward and reverse contactors from being closed in tandem. The interlock circuit transmits the forward and reverse commands to the forward and reverse contactors to close the respective contactor.

The control module is also configured to mount to contactors having different physical sizes. The forward and reverse contactors may be configured to control motors having different current ratings. As a result, the forward and reverse contactors may similarly be configured for different current ratings. As the current rating of a device increases, the wire/conductor size as well as the physical size of other components typically increases as well. As a result, the physical size of the contactor increases to accommodate the increased current rating. The forward and reverse contactors are typically arranged in a side-by-side configuration for a reversing contactor. The control module is configured to mount to the forward and reverse contactors by engaging the second and third connectors with complementary connectors on each of the forward and reverse contactors. Because the size of the forward and reverse contactors changes, the control module is configured to have a variable width. The housing may be configured as a telescoping housing, where one portion of the housing is fixed and a second portion of the housing slides with respect to the fixed portion of the housing to adjust the width of the control module. The second connector may be mounted in the fixed portion of the housing and the third connecter may be mounted in the second portion of the housing, such that the spacing between the two connectors which engage the contactors may be varied according to the physical size of the contactors.

Turning initially to FIG. 1, a reversing contactor 10 and a control module 50 according to one embodiment of the invention are illustrated. The reversing contactor 10 is made up of a pair of individual contactors. A first contactor 20 controls one direction of rotation of a motor, and a second contactor 30 controls an opposite direction of rotation of a motor. For convenience, the first contactor 20 will be discussed herein as the forward contactor and the second contactor 30 will be discussed herein as the reverse contactor. The directions are not intended to be limiting and it is understood that the first contactor 20 may be configured to control reverse rotation of the motor and the second contactor 30 may be configured to control forward rotation of the motor.

Figure 2:
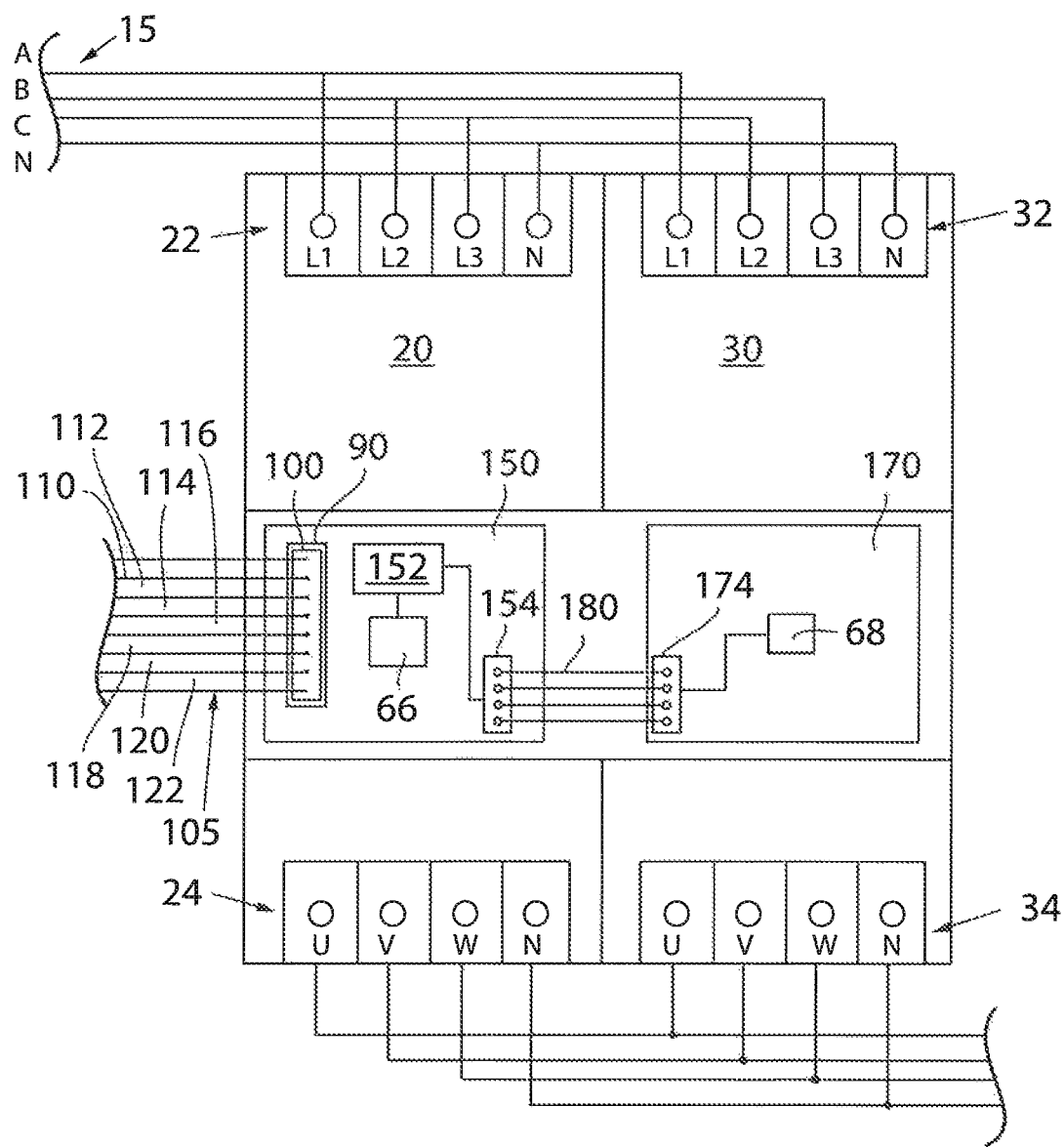
FIG. 2 is a schematic representation of a reversing contactor and a control module according to one embodiment of the invention.
Figure 3:
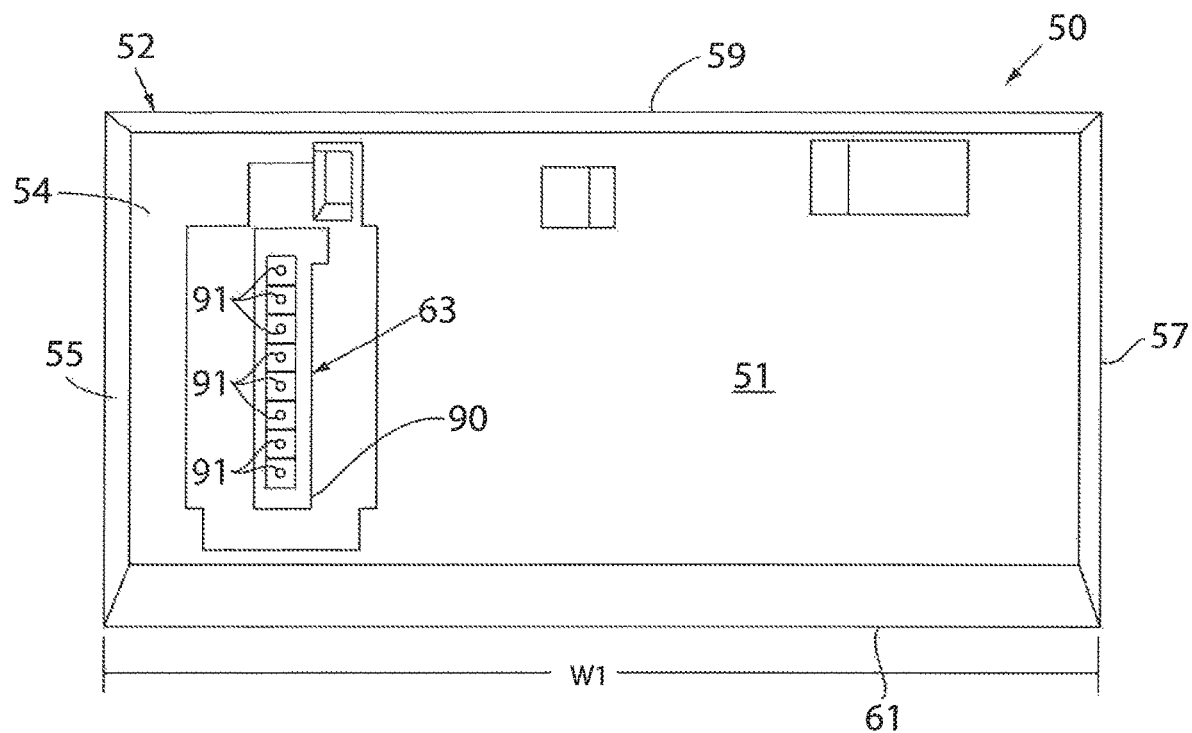
FIG. 3 is a front elevation view of the control module of FIG. 1.
Figure 4:
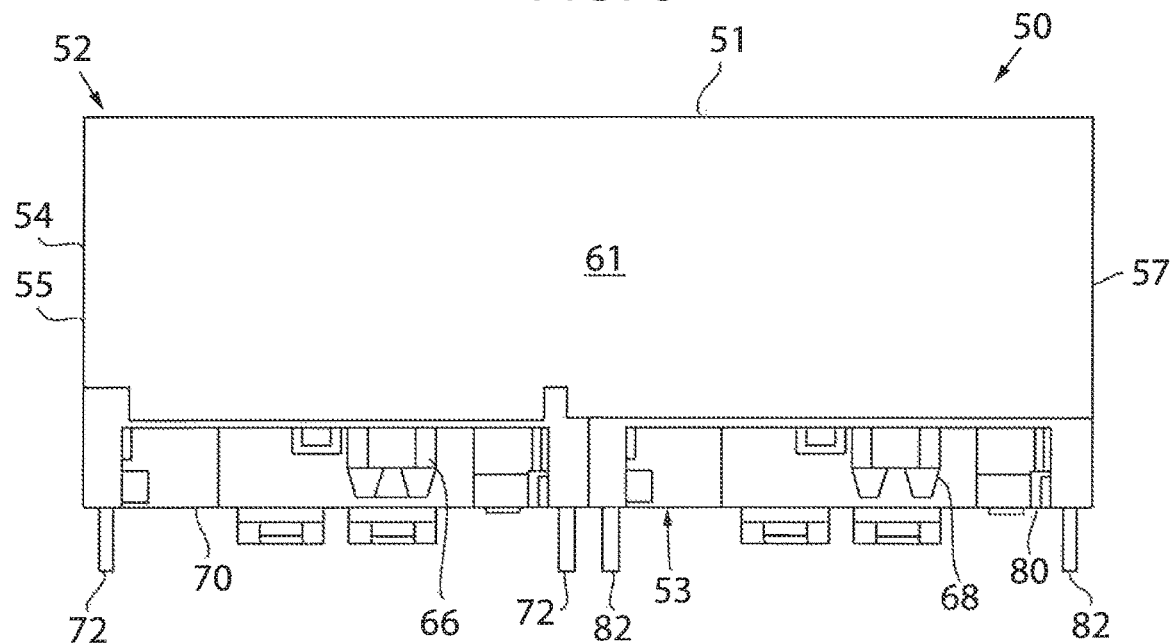
FIG. 4 is bottom plan view of the control module of FIG. 1.
Figure 5:
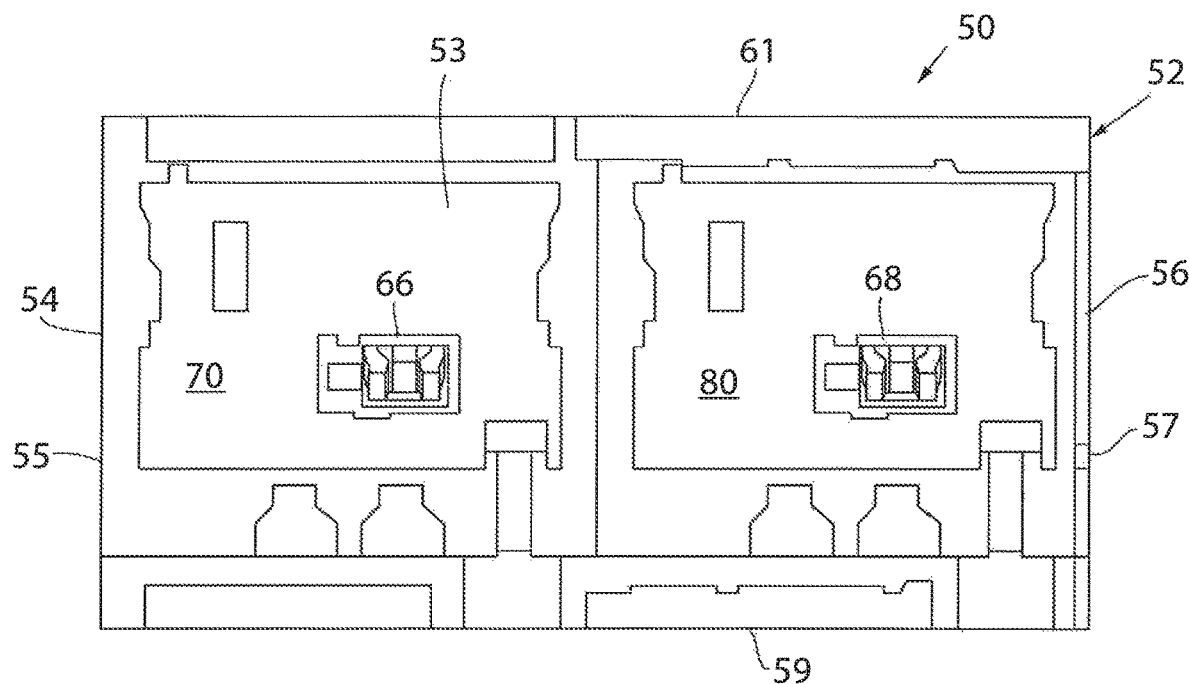
FIG. 5 is a rear elevation view of the control module of FIG. 1.
Figure 6:
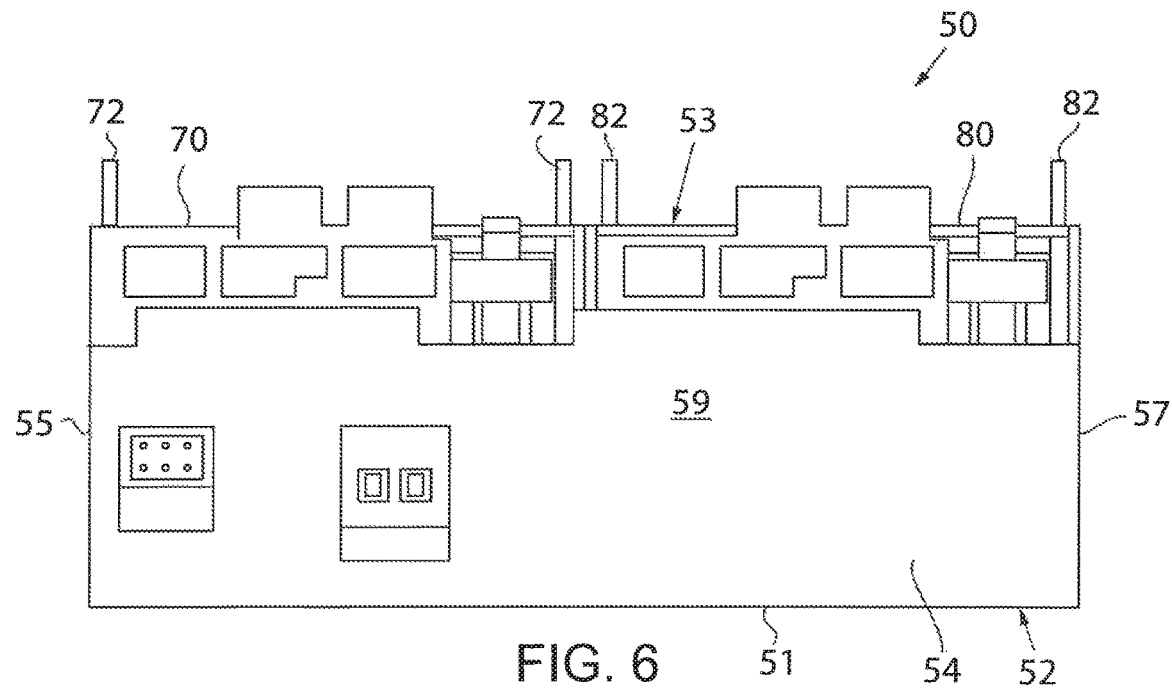
FIG. 6 is top plan view of the control module of FIG. 1.
Figure 7:
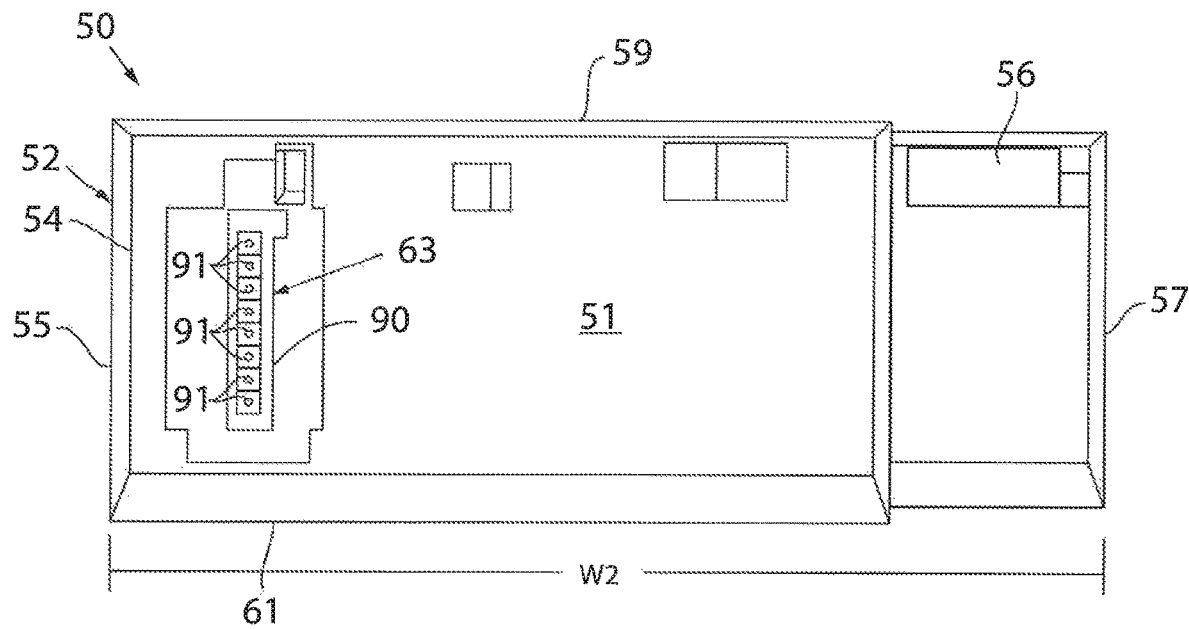
FIG. 7 is a front elevation view of the control module of FIG. 1 with the housing extended.
Figure 8:
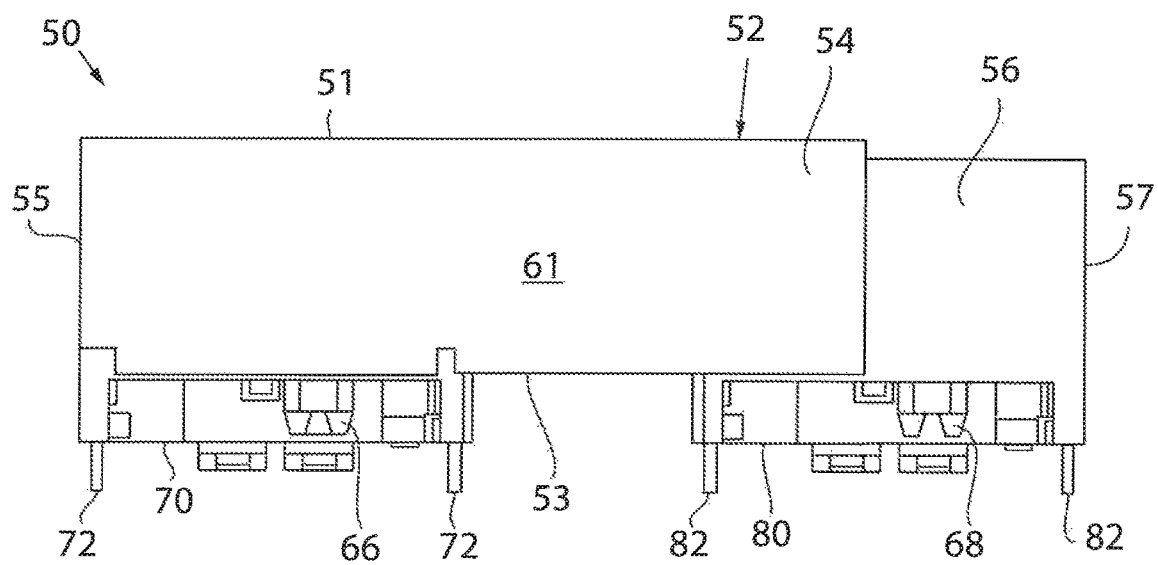
FIG. 8 is bottom plan view of the control module of FIG. 1 with the housing extended.
Figure 9:
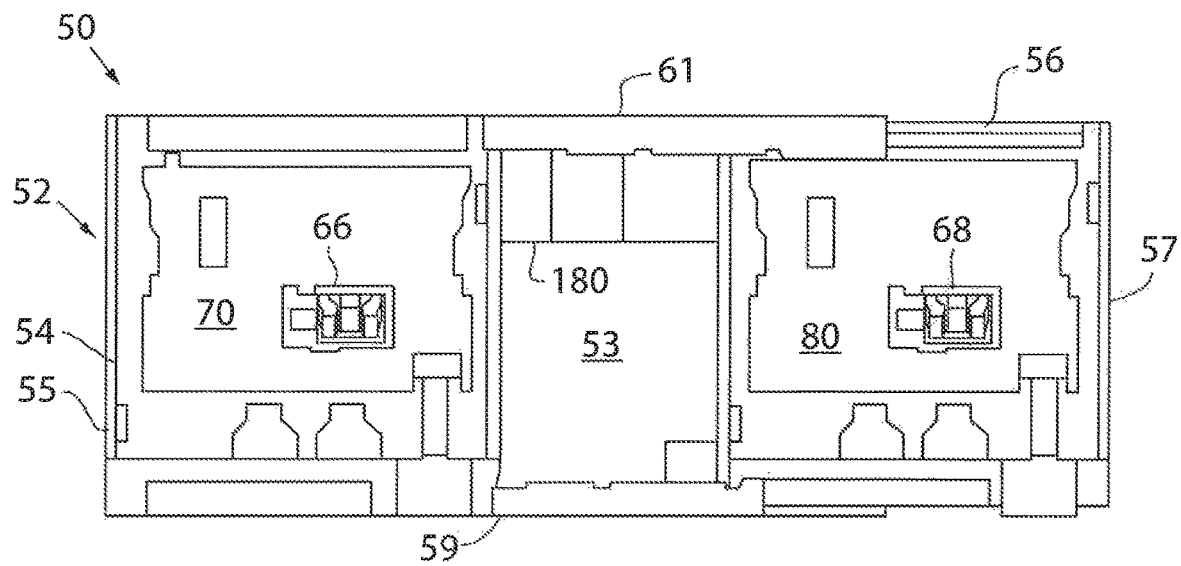
FIG. 9 is a rear elevation view of the control module of FIG. 1 with the housing extended.
Figure 10:
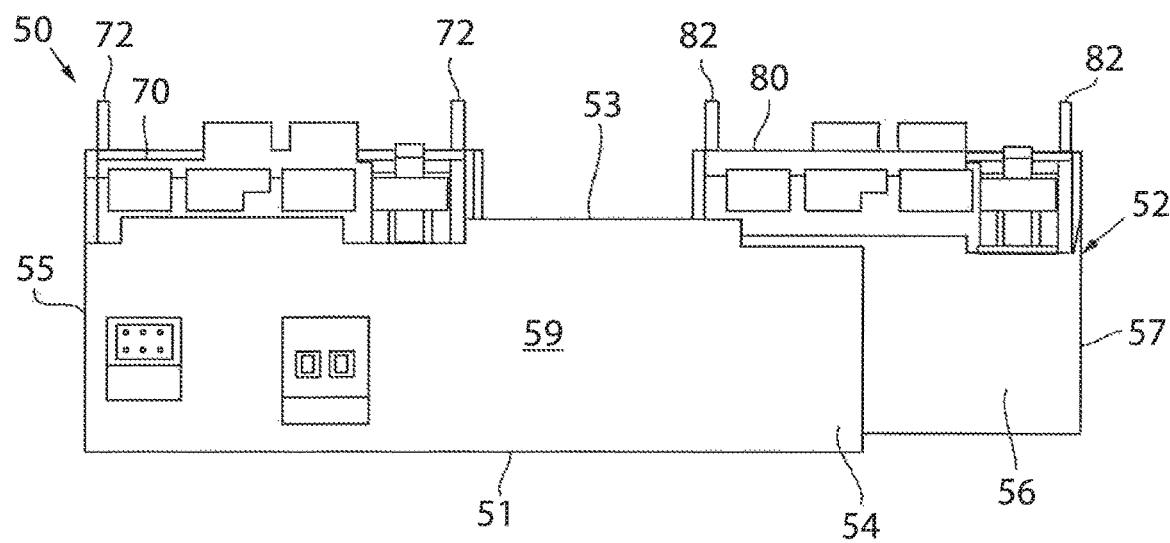
FIG. 10 is top plan view of the control module of FIG. 1 with the housing extended.

With reference also to FIG. 2, each contactor 20, 30 is configured to selectively supply line voltage 15 to a motor when commanded. As shown in FIG. 2, the forward contactor 20 receives a three-phase line voltage 15 at input terminals 22 of the forward contactor. For the forward contactor 20, the three-phase line voltage is connected in a positive sequence with phase A connected to a first input terminal, L1; phase B connected to a second input terminal, L2; and phase C connected to a third input terminal, L3. The reverse contactor 30 also receives the three-phase line voltage 15 at input terminals 32 of the reverse contactor. For the reverse contactor 30, the three-phase line voltage is connected in a negative sequence with phase A connected to a first input terminal, L1; phase C connected to a second input terminal, L2; and phase B connected to a third input terminal, L3. The output terminals of each contactor 20, 30 may be connected to a motor (not shown). According to the illustrated embodiment, the output terminals 24 (U, V, and W) of the forward contactor 20 are connected to the output terminals 34 (U, V, and W) of the reverse contactor 30. The output terminals are then connected to a motor. Internal to each contactor 20, 30 the input terminals 22 or 32 are selectively connected to the output terminals 24 or 34 to supply the line voltage 15 to the motor. When the line voltage 15 is supplied in the positive sequence through the forward contactor 20, the motor is controlled to rotate in the forward direction, and when the line voltage 15 is supplied in the negative sequence through the reverse contactor 30, the motor is controlled to rotate in the reverse direction. As will be discussed in more detail below, the control module 50 is configured to enable only one of the two contactors 20, 30 at a time.

With reference also to FIGS. 3-6, the control module 50 includes a housing 52 having a front surface 51 and a rear surface 53 opposite the front surface. A pair of opposing side surfaces 55, 57 extend between the front surface 51 and the rear surface 53. The housing 52 also includes a top surface 59 and a bottom surface 61 opposite the top surface. Relational terms such as front, rear, top, bottom, left, right, side, upper, lower, and the like are not intended to be limiting. The relational terms are utilized herein with respect to the illustrated embodiments for ease of description. It is understood that the control module 50 and the contactors 20, 30 may be mounted in different orientations, resulting in different relational terms describing like features.

The housing 52 is a telescoping housing to vary the width of the housing and further includes a first portion 54 and a second portion 56. According to the illustrated embodiment, the first portion 54 is considered to be a fixed portion and the second portion 56 is movable with respect to the first portion. As shown in FIGS. 3-6, the second portion 56 is slid into a first position where the second portion 56 is located generally within the front of the housing. When the second portion 56 is in the first position, the housing 52 has a first width, W1. As shown in FIGS. 7-10, the second portion 56 is slidably moved into a second position where the second portion 56 protrudes from one side 57 of the housing 52. When the second portion 56 is in the second position, the housing has a second width, W2. The two sets of figures illustrate the second portion 56 either fully retracted (FIGS. 3-6) or fully extended (FIGS. 7-10). It is contemplated that the second portion 56 may be positioned at any position between the fully retracted or fully extended positions. Because the width of the contactors 20, 30 vary based on the style and/or rating of the contactor, the width of the control module 50 is adjustable to fit on different contactors.

The variable width of the control module 50 allows the mechanical and electrical connections to be made between the control module 50 and the contactors 20, 30 on contactors of varying widths. Each control module 50 includes a first movable connector 66 and a second movable connector 68. The movable connectors 66, 68 are identified as such because they may be configured to detect motion of a plunger on the contactor to which they are mounted. As discussed in more detail below, the moveable connector may include an electrical, mechanical, optical, or other detection method for detecting the state of the contactor 20, 30. The first movable connector 66 is configured to be inserted into a complementary receptacle on the forward contactor 20, and the second movable connector 68 is configured to be inserted into a complementary receptacle on the reverse contactor 30. Each movable connector 66, 68 establishes the electrical connections between the control module 50 and the forward and reverse contactors 20, 30. The movable connectors 66, 68 may also serve, in part, to establish a mechanical connection between the control module 50 and the forward and reverse contactors 20, 30.

Additional stationary connectors are provided to establish the mechanical connection between the control module 50 and the contactors 20, 30. The stationary connectors are identified as such because they are not detecting motion. The stationary connectors provide a mechanical connection between the control module 50 and the contactors 20, 30 and may also include, for example, a spring clip to establish an electrical connection between the control module 50 and each of the forward and revers contactors 20, 30. A first pair of stationary connectors 72 are provided on a first panel 70 on the rear of the control module 50, and a second pair of stationary connectors 82 are provided on a second panel 80 on the rear of the control module 50. Each of the stationary connectors 72, 82 are formed as a tab protruding from the rear surface 53 of the housing 52. A complementary slot on each contactor 20, 30 is configured to receive the tab. Each connector 72, 82 may have, for example, a hook on the end of the tab, where the connectors 72, 82 on the control module 50 are inserted into slots on the contactors 20, 30 and pressed downward to engage the hooks on the housing of the contactor. Optionally, the connector 72, 82 may have a tab that is deflected from its original position as the connector is inserted through an opening on the contactor 20, 30. The connecter may be made of a resilient material such that the tab returns to its original position after being inserted through the opening on the contactor 20, 30 positively retaining the control module 50 to the contactor. It is contemplated that still other configurations of stationary connector 72, 82 and complementary receptacle on the contactor 20, 30 may be utilized without deviating from the scope of the invention. The first pair of stationary connectors 72 are configured to plug into the forward contactor 20, and the second pair of stationary connectors 82 are configured to plug into the reverse contactor 30. At least one of the first panel 70 and the second panel 80 are slidably adjusted with respect to the housing 52 to vary the width of the control module 50. The slidable panel, or panels, are spaced apart at a distance such that the first panel 70 may engage the forward contactor 20 and the second panel 80 may engage the reverse contactor 30. At least one of the movable connectors 66, 68 and one of the stationary connectors 72, 82 are mounted to the slidable panel, allowing a spacing between the pair of movable connectors 66, 68 and between the pair of stationary connectors 72, 78 to be adjusted and then the control module 50 is press-fit onto the contactors such that the movable connectors 66, 68 and the stationary connectors 72, 82 on the control module engage the complementary connectors on the contactors to retain the control module 50 to the contactors.

In operation, the control module 50 receives the command signals for controlling operation of the reversing contactor 10 and manages activation of the first and second contactors 20, 30 to ensure that the contactors are not energized in tandem. With reference again to FIGS. 1 and 2, a connector 90 is accessible via an opening 63 in the front surface 51 of the housing 52. According to one embodiment of the invention, the connector 90 may be configured to receive discrete signals on individual pins 91 in the connector. As illustrated in FIG. 2, a ribbon cable 105 may be provided to conduct command signals to the control module 50 and to transmit feedback signals from the control module 50. A first conductor 110 in the ribbon cable 105 may supply control power to the control module 50. The control power may be, for example, twenty-four volts (24 VDC), forty-eight volts (48 VDC) or any other suitable control voltage according to the application requirements. A second conductor 112 in the ribbon cable 105 may be used to conduct the state of the forward contactor 20, and a third conductor 114 in the ribbon cable 105 may be used to conduct the state of the reverse contactor 30. A fourth conductor 116 may provide a common connection for both status signals conducted in the second and third conductors. A fifth conductor 118 in the ribbon cable 105 may provide a first command signal to the control module 50, where the first command signal controls operation of the forward contactor 20. A sixth conductor 120 in the ribbon cable 105 may provide a second command signal to the control module 50, where the second command signal controls operation of the reverse contactor 30. A seventh conductor 122 in the ribbon cable 105 may provide a common reference for both command signals conducted in the fifth and sixth conductors.

According to another embodiment of the invention, the connector 90 may be configured to connect to an industrial network. The control module 50 may include a network interface operative to receive data packets from and transmit data packets via the industrial network. The status signals for each contactor 20, 30 may be inserted into a data packet and transmitted from the control module 50 and the command signals may be received in a data packet and extracted by the network interface for use in the control module 50.

Figure 12:
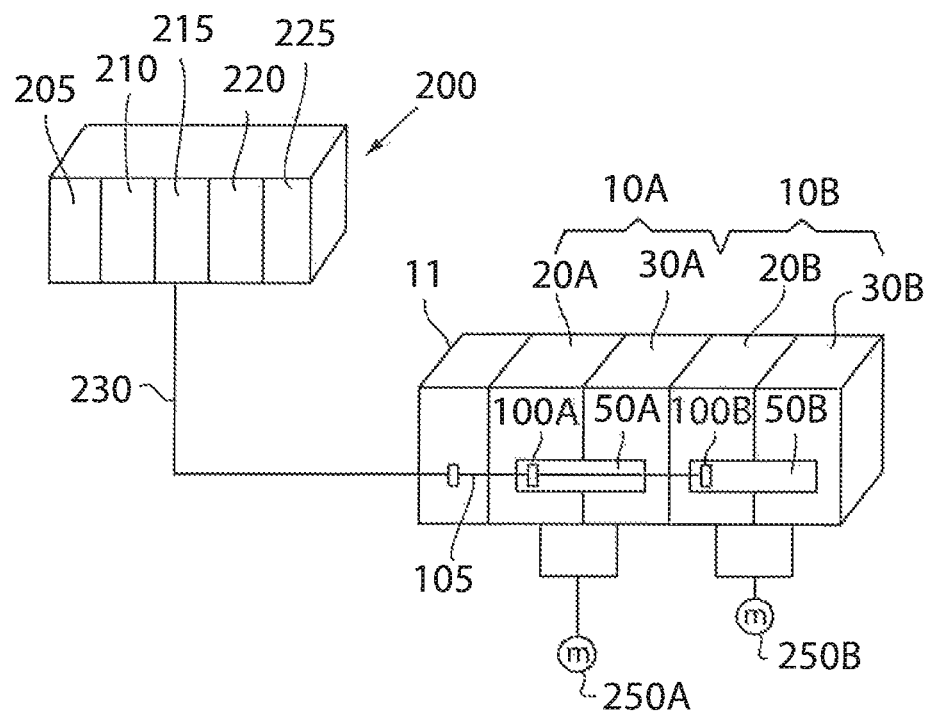
FIG. 12 is a schematic representation of an industrial controller connected to multiple contactors and multiple control modules.

Turning next to FIG. 12, an exemplary environment is illustrated in which a pair of reversing contactors 10 are included. An industrial controller 200, such as a PLC, includes a power supply module 205, a processing module 210, a network module 215, an input module 220, and an output module 225. It is contemplated that the industrial controller 200 may take many different configurations and include various additional modules and/or various combinations of the illustrated modules. A network cable 230 connects the network module 215 to a gateway 11. The gateway 11 may be located within the same control cabinet or at a remote location in a separate control cabinet from the industrial controller 200. The gateway receives data packets from then network module 215 according to the protocol for the industrial network and extracts data to be transmitted via discrete signals on a ribbon cable 105 to the reversing contactors 10. A first reversing contactor 10A controls operation of a first motor 250A, and a second reversing contactor 10B controls operation of a second motor 250B. The processing module 210 is configured to execute a control program to generate forward and reverse command signals for each motor 250A, 250B and transmit the command signals via the network module 215 and the network cable 230. Each control module 50A, 50B receives the status of the contactors 20, 30 and transmits the status to the gateway 11, where the gateway inserts the status into a data packet transmitted back to the processing module 210 via the network module 215.

Figure 11:
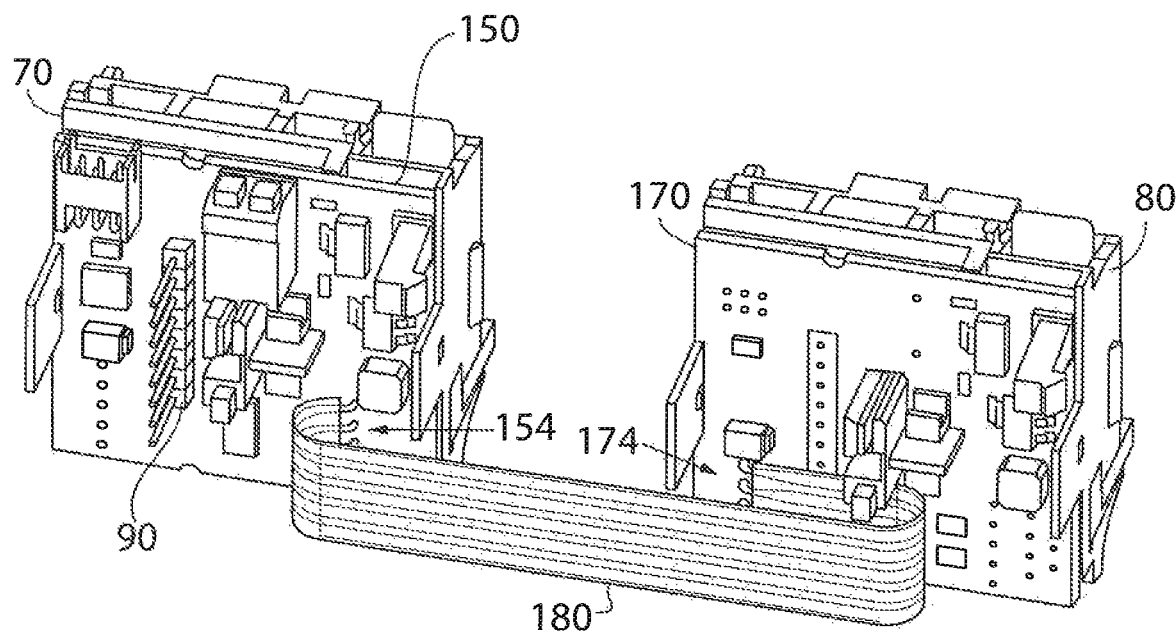
FIG. 11 is partial perspective view illustrating the circuit boards and panels of the control module of FIG. 1.

With reference again to FIG. 2, the first and second command signals are received at the connector 90 of the control module 50 and are then transmitted to a control circuit 152. The control circuit 152 may include the network interface if the control module 50 is configured to receive the command signals from an industrial network. The control circuit 152 also includes an interlock circuit which is used to prevent the control module 50 from closing both the forward contactor 20 and the reverse contactor 30 in tandem. With reference also to FIG. 11, the first panel 70 includes a first printed circuit (PC) board 150, and the second panel 80 includes a second PC board 170. The first PC board 150 includes a first set of terminals 154, and the second PC board 170 includes a second set of terminals 174. Each set of terminals 154, 174 may include pins extending from the respective PC board and require a cable 180 be soldered to the pins. Optionally, the terminals 154, 174 may be part of a first half of a connector and the cable 180 may have the second half of the connector mounted to each end, where the cable 180 is then attached via the connector. The cable 180 conducts signals between the two circuit boards as required and has a loop, allowing for two PC boards to remain connected as the first panel 70 and second panel 80 are slidably adjusted within the housing 52 of the control module 50.

The interlock circuit within the control circuit 152 receives feedback signals corresponding to the present operating state of both the forward contactor 20 and the reverse contactor 30. According to one embodiment of the invention, the forward contactor 20 and the reverse contactor 30 each include an auxiliary contact configured to provide an output signal corresponding to whether the contact is open or closed. The output signal may be conducted from the forward contactor 20 to the control module 50 via the first movable connector 66 and from the reverse contactor 30 to the control module via the second movable connector 68. These feedback signals are then transmitted from the respective connectors with the contactors to the interlock circuit.

According to another embodiment of the invention, the control module 50 includes alternate methods of detecting the state of the forward and reverse contactors 20, 30. Each contactor includes a plunger which is typically viewable from the front of the contactor. When the contactor is off, or de-energized, the plunger is pushed outward, toward the surface of the contactor to which the control module 50 mounts. When the contactor is on, or energized, the plunger is drawn into the contactor, away from the surface of the contactor to which the control module 50 mounts. It is contemplated that the either the rear surface 53 of the control module 50 or each movable connector 66, 68 may include an additional apparatus to detect the state of the contactors 20, 30 to which the control module 50 is mounted. For example, a microswitch may be positioned on the rear of the control module or within the movable connector and extending from the control module a sufficient distance, such that the microswitch is closed by the plunger when the contactor is de-energized and the microswitch is open as a result of the plunger being drawn into the contactor when the contactor is energized. Optionally, the control module 50 may, in turn, include a second plunger configured to engage the first plunger, where the second plunger travels in and out with the plunger in the contactor 20, 30. The control module 50 may include any suitable detection means internal to the control module 50 to detect the change in position of the second plunger. According to still another option, the control module 50 may include an optical sensor, where the optical sensor emits a signal toward the end of the plunger. The optical sensor may use, for instance, a time-of-flight calculation to detect how long light emitted from the sensor takes to return to the sensor to determine the present state of the plunger in the contactor. Any of the detection apparatus may generate a suitable feedback signal to the interlock circuit to indicate the present operating state of each contactor 20, 30.

The interlock circuit may include integrated circuits (ICs) mounted to either the first circuit board 150 or the second circuit board 170. The ICs may include digital logic which utilizes the feedback signals from the contactors 20, 30 or from the detection circuits and the command signals corresponding to desired operation of the contactors 20, 30 to prevent both contactors from being closed in tandem. For instance, when the control module 50 receives the first command signal to close the forward contactor 20, the digital logic may require that the feedback signal from the reverse contactor 30 indicate that the reverse contactor is open before transmitting the first command signal to the first movable connector 66 and, in turn, to the forward contactor 20. Similarly, when the control module 50 receives the second command signal to close the reverse contactor 30, the digital logic may require that the feedback signal from the forward contactor 20 indicate that the forward contactor is open before transmitting the second command signal to the second movable connector 68 and, in turn, to the reverse contactor 30. Thus, the interlock circuit included in the control circuit 152 of the control module 50 replaces the external wiring and external relays previously required for a reversing contactor. Further, a single connector 90 is plugged into the control module 50 to provide for control of both the forward contactor 20 and the reverse contactor 30, thereby simplifying wiring which will reduce assembly time and reduce the potential for wiring error.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

We claim:

1. A control module for a first contactor and a second contactor defining, at least in part, a reversing contactor, the control module comprising:
   a housing configured to be mounted to the first contactor and to the second contactor;
   a first connector accessible via an opening in the housing, wherein the first connector is configured to receive a complementary control connector;
   a second connector mounted within the housing, wherein the second connector is configured to connect to the first contactor;
   a third connector mounted within the housing, wherein the third connector is configured to connect to the second contactor; and
   an interlock circuit mounted within the housing, wherein:
      the interlock circuit is operatively connected between the first connector and each of the second and third connectors,
      the complementary control connector is configured to deliver a first command signal and a second command signal to the control module,
      the first command signal is conducted from the first connector to the second connector via the interlock circuit to control operation of the first contactor,
      the second command signal is conducted from the first connector to the third connector via the interlock circuit to control operation of the second contactor, and
      the interlock circuit prevents the first contactor and the second contactor from closing in tandem.

2. The control module of claim 1 wherein:
   the first connector includes a plurality of terminals and each terminal is configured to conduct a discrete signal;
   the first command signal is a first discrete signal received at the first connector; and
   the second command signal is a second discrete signal received at the second connector.

3. The control module of claim 1 wherein the first connector is configured to connect to an industrial network, the control module further comprising a network interface in communication with the first connector, wherein the network interface is configured to receive the first and second command signals from the first connector and to transmit the first and second command signals to the interlock circuit.

4. The control module of claim 1 wherein:
the second connector receives at least one first status signal from the first contactor;
the third connector receives at least one second status signal from the second contactor;
the at least one first and second status signals are transmitted from the second and third connectors to the first connector.

5. The control module of claim 1 wherein the housing includes an adjustable width and is configured to mount to first and second contactors of varying widths.

6. The control module of claim 5 further comprising:
a first panel, wherein the second connector extends from the first panel to connect to the first contactor; and
a second panel, wherein the third connector extends from the second panel to connect to the second contactor, wherein at least one of the first panel and the second panel is slidably mounted to the housing.

7. The control module of claim 6 wherein
the housing is a telescoping housing including a fixed housing member and a movable housing member,
the first panel is mounted to the fixed housing member, and
the second panel is mounted to the movable housing member.

8. A method for controlling a first contactor and a second contactor defining, at least in part, a reversing contactor, the method comprising the steps of:
mounting a control module to the first contactor and to the second contactor, wherein the control module includes:
a housing,
a first connector extending from the housing and configured to engage the first contactor, and
a second connector extending from the housing and configured to engage the second contactor;
receiving at a third connector in the control module a first command signal and a second command signal, wherein the first command signal controls operation of the first contactor and the second command signal controls operation of the second contactor;
transmitting the first command signal and the second command signal from the third connector to an interlock circuit mounted within the housing;
verifying that the second contactor is open with the interlock circuit prior to transmitting the first command signal to the first contactor via the first connector; and
verifying that the first contactor is open with the interlock circuit prior to transmitting the second command signal to the second contactor via the second connector.

9. The method of claim 8 wherein:
the third connector includes a plurality of terminals and each terminal is configured to conduct a discrete signal;
the first command signal is a first discrete signal received at the third connector; and
the second command signal is a second discrete signal received at the third connector.

10. The method of claim 8 wherein the third connector is configured to connect to an industrial network, the method further comprising the steps of:
receiving a plurality of data packets from the third connector with a network interface mounted within the control module;
extracting the first command signal and the second command signal from the plurality of data packets with the network interface; and
transmitting the first and second command signals from the network interface to the interlock circuit.

11. The method of claim 8 further comprising the steps of:
receiving at least one first status signal from the first contactor via the first connector; and
receiving at least one second status signal from the second contactor via the second connector, wherein:
the step of verifying that the second contactor is open with the interlock circuit prior to transmitting the first command signal to the first contactor via the first connector uses the at least one second status signal, and
the step of verifying that the first contactor is open with the interlock circuit prior to transmitting the second command signal to the second contactor via the second connector uses the at least one first status signal.

12. The method of claim 8 wherein the housing includes an adjustable width and is configured to mount to first and second contactors of varying widths.

13. The method of claim 8 further comprising the step of slidably adjusting the width of the housing by moving at least one of a first panel and a second panel, wherein:
the first connector extends from the first panel to connect to the first contactor,
the second connector extends from the second panel to connect to the second contactor,
the housing is a telescoping housing including a fixed housing member and a movable housing member,
the first panel is mounted to the fixed housing member, and
the second panel is mounted to the movable housing member.

14. A control module for a first contactor and a second contactor defining, at least in part, a reversing contactor, the control module comprising:
a housing configured to be mounted to the first contactor and to the second contactor;
a first connector configured to receive a complementary control connector via a first opening in the housing;
a first circuit board mounted within the housing;
a second connector mounted to the first circuit board and extending through a second opening in the housing, wherein the second connector is configured to connect to the first contactor;
a second circuit board mounted within the housing; and
a third connector mounted to the second circuit board and extending through a third opening in the housing, wherein the third connector is configured to connect to the second contactor, wherein:
the complementary control connector is configured to deliver a first command signal and a second command signal to the control module,
the first command signal is conducted from the first connector to the second connector to control operation of the first contactor,
the second command signal is conducted from the first connector to the third connector to control operation of the second contactor, and
the housing has an adjustable width and is configured to mount to first and second contactors of varying widths.

15. The control module of claim 14 wherein:
the first connector includes a plurality of terminals and each terminal is configured to conduct a discrete signal;
the first command signal is a first discrete signal received at the first connector; and the second command signal is a second discrete signal received at the second connector.

16. The control module of claim 14 wherein the first connector is configured to connect to an industrial network, the control module further comprising a network interface in communication with the first connector, wherein the network interface is configured to receive the first and second command signals from the first connector.

17. The control module of claim 14 wherein:
the second connector receives at least one first status signal from the first contactor;
the third connector receives at least one second status signal from the second contactor;
the at least one first and second status signals are transmitted from the second and third connectors to the first connector.

18. The control module of claim 14 further comprising:
a first panel, wherein the first circuit board is mounted to the first panel; and
a second panel, wherein the second circuit board is mounted to the second panel, wherein at least one of the first panel and the second panel is slidably mounted to the housing.

19. The control module of claim 18 wherein
the housing is a telescoping housing including a fixed housing member and a movable housing member,
the first panel is mounted to the fixed housing member, and
the second panel is mounted to the movable housing member.

20. The control module of claim 19 further comprising an interlock circuit mounted within the housing, wherein:
the interlock circuit is operatively connected between the first connector and each of the second and third connectors,
the first command signal is conducted from the first connector to the second connector via the interlock circuit,
the second command signal is conducted from the first connector to the third connector via the interlock circuit, and
the interlock circuit prevents the first contactor and the second contactor from closing in tandem.

* * * * *